United States Patent
Citta et al.

(10) Patent No.: US 6,647,074 B2
(45) Date of Patent: Nov. 11, 2003

(54) REMOVAL OF CLOCK RELATED ARTIFACTS FROM AN OFFSET QAM GENERATED VSB SIGNAL

(75) Inventors: Richard W. Citta, Oak Park, IL (US); Larry E. Nielsen, Chicago, IL (US)

(73) Assignee: Zenith Electronics Corporation, Lincolnshire, IL (US)

( * ) Notice: Subject to any disclaimer, the term of this patent is extended or adjusted under 35 U.S.C. 154(b) by 0 days.

(21) Appl. No.: 09/982,723

(22) Filed: Oct. 18, 2001

(65) Prior Publication Data

US 2002/0034262 A1 Mar. 21, 2002

Related U.S. Application Data

(62) Division of application No. 09/139,496, filed on Aug. 25, 1998, now abandoned.

(51) Int. Cl.[7] .............................................. H04L 27/36
(52) U.S. Cl. .................... 375/298; 375/261; 375/285; 375/270; 375/301; 332/103; 332/170
(58) Field of Search ................... 375/298, 277, 375/261, 268, 270, 285, 296, 300, 301; 332/103, 149, 170; 348/555; 327/307

(56) References Cited

U.S. PATENT DOCUMENTS

| | | | | |
|---|---|---|---|---|
| 4,291,277 A | * | 9/1981 | Davis et al. ................ | 330/149 |
| 5,181,112 A | * | 1/1993 | Citta et al. .................. | 358/141 |
| 5,555,024 A | * | 9/1996 | Limberg ...................... | 348/473 |
| 5,612,975 A | * | 3/1997 | Becker et al. ............... | 375/319 |
| 5,699,383 A | * | 12/1997 | Ichiyishi ...................... | 375/297 |
| 5,986,691 A | * | 11/1999 | Henderson ................... | 725/111 |
| 5,999,223 A | * | 12/1999 | Patel et al. .................. | 348/555 |
| 6,005,894 A | * | 12/1999 | Kumar ........................ | 375/270 |
| 6,091,932 A | * | 7/2000 | Langlais ..................... | 455/5.1 |
| 6,184,921 B1 | * | 2/2001 | Limberg ...................... | 348/21 |
| 6,198,777 B1 | * | 3/2001 | Feher .......................... | 375/295 |
| 6,243,369 B1 | * | 6/2001 | Grimwood et al. .......... | 370/335 |
| 6,282,187 B1 | * | 8/2001 | Evans et al. ................. | 370/347 |
| 6,313,703 B1 | * | 11/2001 | Wright et al. ................ | 330/149 |

* cited by examiner

Primary Examiner—Jean B. Corrielus

(57) ABSTRACT

Circuits for removing clock related artifacts in an offset QAM generated VSB signal includes a transmitter arrangement and a receiver arrangement. In the transmitter, a detector detects the artifacts and a correlator determines whether the artifacts repeat over two symbols or over four symbols. A signal indicative of the artifacts is used to control processing circuits for adjusting the ratios and levels of the I and Q signal components of the QAM signal for substantially eliminating the artifacts. In the receiver, the received VSB signal is divided into four parallel signals. Each parallel signal is processed to develop an average symbol level that is subtracted before the parallel signals are recombined. The four symbol repeat rate artifacts reflect a DC offset of the VSB signal symbols, which are both positive-going and negative-going and which therefore average to zero for random signals. Averaging is done over N symbols where N is a power of 2. The two symbol repeat rate artifacts reflect an improper I and Q signal components ratio, and are removed with the four symbol repeat rate artifacts.

5 Claims, 1 Drawing Sheet

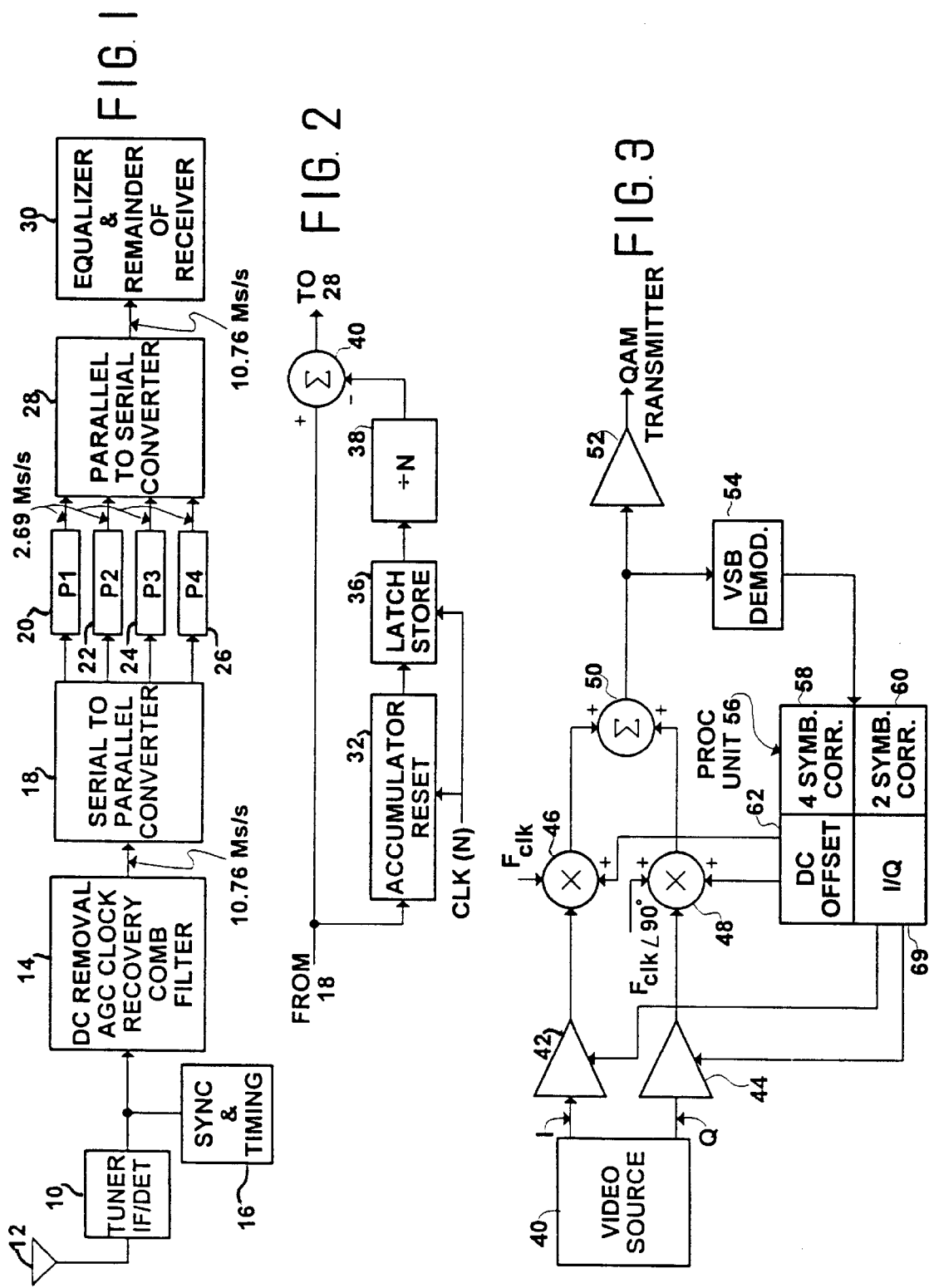

REMOVAL OF CLOCK RELATED ARTIFACTS FROM AN OFFSET QAM GENERATED VSB SIGNAL

CROSS REFERENCE TO RELATED APPLICATION

This application is a division of application Ser. No. 09/139,496, filed Aug. 25, 1998, of the same inventor and having the same title now abandoned.

BACKGROUND OF THE INVENTION AND PRIOR ART

This invention relates generally to a method and apparatus for removing artifacts in a vestigial sideband modulation (VSB) signal and more particularly to the removal of symbol clock related artifacts that may occur in a VSB signal when produced by an offset QAM (Phase Amplitude Modulation) generator.

It is well known that a QAM signal generator can be offset to generate a VSB signal. In such an arrangement, the I (in-phase) and Q (quadrature) signal components alternate in time, whereas in a conventional QAM signal, the I and Q signal components occur at the same time. The signal generated by a perfectly operating Offset QAM system is identical to, and cannot be distinguished from, a VSB signal, before the addition of the QAM carrier or the VSB pilot. The VSB pilot is placed 310 KHz from one edge of the 6 MHz band, whereas the QAM carrier is positioned in the center of the 6 MHz band. The symbol clock runs at 10.76 MHz and when the signal is demodulated from the pilot (in a VSB receiver) the center of the band is at 2.69 MHz (3.0 MHz minus 310 KHz). Therefore, any DC offset in the QAM generated VSB signal appears as a continuous wave (CW) of 2.69 MHz frequency, which represents one form of artifact. This artifact is at one-fourth of the clock frequency of 10.76 MHz and thus extends over (i.e., repeats) every four symbols. Another form of artifact is due to an imbalance in the I/Q components ratio of the mixers. This artifact repeats every two symbols and manifests itself in an amplitude tilt across the channel. These artifacts must be removed at either the transmitter or the receiver in order to provide a usable VSB signal. At the present time, the CW can be manually nulled out at the transmitter with a suitable control adjustment. However, the adjustment is very sensitive to drift and not suitable for practical applications. Artifacts due to an improper I/Q ratio are not presently dealt with.

The present invention provides a relatively simple, cost-effective method and apparatus for nulling out the artifacts that may appear in a VSB signal that is generated by an offset QAM generator. In one form of the invention, the artifacts are removed at the transmitter site and in another form of the invention the artifacts are eliminated at the individual VSB receiver site.

OBJECTS OF THE INVENTION

A principal object of the invention is to provide a novel VSB system and method.

Another object of the invention is to provide a VSB system that uses a VSB signal produced by an offset QAM generator.

A further object of the invention is to provide a method and apparatus for removing artifacts from an offset QAM generated VSB signal.

BRIEF DESCRIPTION OF THE DRAWINGS

These and other objects and advantages of the invention will be apparent upon reading the following description in conjunction with the drawings in which:

FIG. 1 is a simplified block diagram illustrating the inventive method and apparatus in a VSB receiver;

FIG. 2 is an expanded view of one of the multiple path signal processing circuits of FIG. 1; and FIG. 3 is a simplified block diagram illustrating the inventive method and apparatus as applied to a QAM transmitter.

DETAILED DESCRIPTION OF PREFERRED EMBODIMENT

In a digital VSB system, the symbols are both positive-going and negative-going. For a signal having a random symbol distribution, the average symbol level is zero (except for a small DC offset that results when the pilot is added to the VSB signal). Any artifacts that occur in the VSB signal produce symbol errors. As discussed above, these artifacts may have a two symbol repeat rate due to an improper I/Q ratio or a four symbol repeat rate due to a DC offset in the I and Q signal components. The invention removes these artifacts in the receiver by dividing the VSB signal into four parallel paths, each path being processed at one-fourth of the symbol rate, averaging the symbols over N symbols and subtracting the average symbol levels from their respective parallel path signals. (Eight parallel paths, with each path being processed at one-eighth the symbol rate, may also be used.) As mentioned above, the randomly occurring VSB symbols average out to zero in each path, so the average symbol level reflects the presence of artifacts which, not being random, repetitively occur at the same point in each path (but at a different point in each of the four parallel paths) and do not average to zero in any of the paths. The artifacts are thus subtracted (removed) from each of the parallel path signals before the parallel signals are recombined into a single signal. N is selected to be a power of 2 for processing convenience, it being understood that the larger the value of N, the more likely that the VSB symbols processed will indeed be random and average to zero.

Referring to FIG. 1, a simplified block diagram of a VSB receiver is illustrated. A tuner/IF/detector 10 receives signals from an antenna 12 and, after suitable well-known processing thereof, supplies the detected signals to a block 14 that may include a DC recovery circuit, an AGC/sync recovery circuit and a comb filter for further processing. The output of block 14 is a serial stream of multilevel symbols. This serial stream occurs at a constant rate of 10.76 Megasymbols/sec and is supplied to a serial to parallel converter 18 to create four parallel path signals therefrom. The symbols in each of the four parallel paths 20, 22, 24 and 26 occur at one-fourth of the serial symbol rate (10.76/4= 2.69 Megasymbols/sec) which, as discussed above, is also the rate of the CW produced by a DC offset in the VSB signal. Each of the four parallel paths includes an identical symbol processor (P1–P4), one of which is fully disclosed in FIG. 2. The resulting parallel signal outputs of the symbol processors are supplied to a parallel to serial converter 28 where they are recombined into a 10.76 Megasymbols/sec serial VSB output signal that is free of artifacts that have a two symbol repeat rate or a four symbol repeat rate. This signal is supplied to a block 30 that includes equalization circuitry and the remainder of the VSB receiver processing circuits, e.g., a trellis decoder, a symbol/byte converter, a convolutional deinterleaver, an R-S decoder, a derandomizer, data recovery circuits and conventional audio and video processing circuits. The comb filter in circuit 14 may be included in block 30, if desired.

In FIG. 2, parallel path 20 is shown in detail to illustrate the arrangement of the parallel path processor P1, it being understood that the other parallel paths and processors are identical. The parallel path symbol signal is applied to an accumulator 32. Accumulator 32 is reset by a clock signal (clk) that occurs every N symbols in each of the parallel paths so as to add (accumulate) N successive symbols in the path. The output of accumulator 32 is applied to a latch 36 that stores the value accumulated in accumulator 32. The output of latch 36 is coupled to a divide-by-N circuit 38, with the result being that an average symbol level is derived over a period of N symbols. This average symbol level is supplied to a subtractor 40 where it is subtracted from its corresponding parallel path signal to produce a resulting parallel signal that is corrected for the clock related artifacts that may have been present.

The clock related artifacts may also be removed from the QAM transmitter signal as will be seen in connection with FIG. 3. A video source 11 supplies an I signal component to an amplifier 42 and a Q signal component to an amplifier 44. The outputs of amplifiers 42 and 44 are coupled to a pair of multipliers 46 and 48, respectively that are supplied with ninety degrees phase displaced clock signals Fclk and Fclk/90°, respectively, for interleaving the successively I and Q signal components in time, rather than having them occur at the same times as in a conventional QAM signal. The outputs of multipliers 46 and 48 are supplied to an adder 50, the output of which is further amplified and supplied to the QAM transmitter circuitry (not shown). The output of adder 50 is a VSB signal and is also supplied to a VSB demodulator 54 that supplies a processing unit 56. Processing unit 56 includes a two symbol correlator 60 and a four symbol correlator 58 that determines artifacts that have a two symbol repeat rate and a four symbol repeat rate, respectively. Artifacts having a four symbol repeat rate represent a DC offset in the I and Q signal components and are removed by appropriately adjusting the gains of multipliers 46 and 48. This is accomplished through a DC offset circuit 62 that measures the four symbol repeat rate error and supplies appropriate corrective signals to the mixers. Similarly, two symbol repeat rate artifacts, representing an error in the I/Q ratio, are determined by correlator 60, which generates suitable corrective signals for controlling the balance between amplifiers 42 and 44, thereby adjusting the ratio of the I and Q signal components.

What has been described is a novel method and apparatus for removing the symbol clock related artifacts that may occur in a VSB signal that is produced by an offset QAM generator. It is recognized that numerous changes to the described embodiment of the invention will be apparent without departing from its true spirit and scope. The invention is to be limited only as defined in the claims.

What is claimed is:

1. A method of producing an offset QAM generated VSB signal from QAM generator processing circuits comprising:

detecting symbol clock related artifacts in the generated VSB signal;

developing a signal indicative of the detected artifacts; and using the developed signal to adjust the QAM generator processing circuits to substantially eliminate the artifacts.

2. The method of claim 1, wherein the detected artifacts reflect a four symbol repeat rate in the generated VSB signal, and further comprising:

adjusting the DC offset of the generated VSB signal in response to the developed signal.

3. The method of claim 1, wherein the detected artifacts reflect a two symbol repeat rate in the generated VSB signal, and further comprising:

adjusting the ratio of the I and Q signal components in the generated VSB signal in response to the developed signal.

4. The method of claim 1, wherein the detected artifacts reflect two and four symbol repeat rates in the generated VSB signal, and further comprising:

adjusting both the DC offset and the ratio of the I and Q signal components in the generated VSB signal in response to the developed signal.

5. An offset QAM transmitter for generating a VSB signal comprising:

I and O channel processing means;

means for detecting artifacts characterized by a known symbol repeat rate in said VSB signal;

means for adjusting said I and Q channel processing means for substantially eliminating said artifacts:

wherein said means for detecting comprises:

a symbol correlator for determining any of said artifacts that repeat over two symbols and any of said artifacts that repeat over four symbols;

and wherein said adjusting means comprises:

means for adjusting the DC offset of said I and Q channel processing means for said artifacts that repeat over four symbols; and means for adjusting the ratio of the I and Q signals from said I and Q channel processing means for said artifacts that repeat over two symbols.

* * * * *